Oct. 19, 1965 T. H. OXLEY 3,212,161

MANUFACTURE OF SEMICONDUCTOR VALVES

Filed July 10, 1962

INVENTOR
TERENCE HUNTER OXLEY
BY
Kirschstein, Kirschstein & Ottinger
ATTORNEYS

United States Patent Office 3,212,161
Patented Oct. 19, 1965

3,212,161

MANUFACTURE OF SEMICONDUCTOR VALVES

Terence Hunter Oxley, Croxley Green, England, assignor to The General Electric Company Limited, London, England Filed July 10, 1962, Ser. No. 208,738
Claims priority, application Great Britain, July 12, 1961, 25,321/61
3 Claims. (Cl. 29—25.3)

Figures 1, 2:
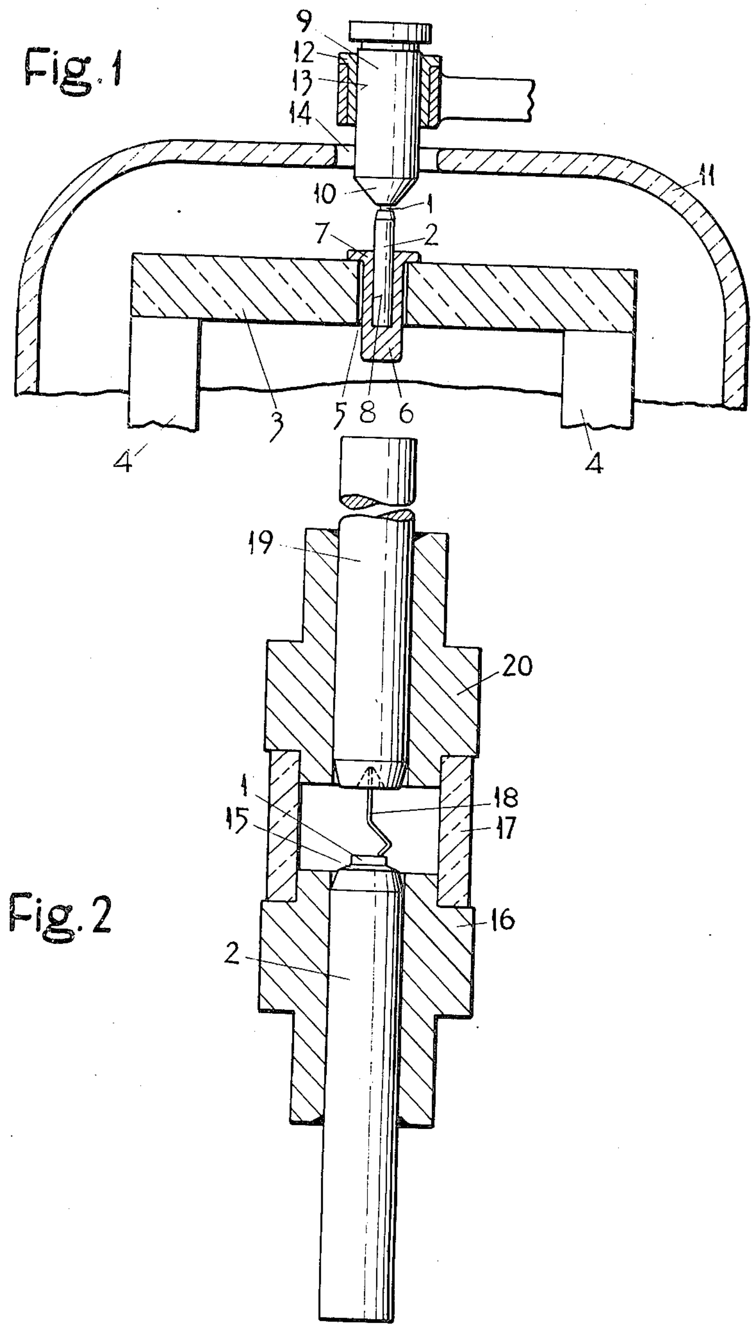

This invention relates to the manufacture of semiconductor valves, for example semiconductor diodes and transistors.

The invention is concerned in particular with the manufacture of semiconductor valves of the kind incorporating a semiconductor body which is bonded to a metallic member which provides a large area ohmic contact.

It is an object of the invention to provide a method of manufacturing a semiconductor valve of the kind specified which is improved in respect of the amount of noise generated in the valve in operation. Such an improvement is of particular importance for diodes intended for use as high frequency mixer diodes.

According to the invention, a method of manufacturing a semiconductor valve includes the steps of placing a semiconductor wafer in contact with a metallic support which is capable of alloying with the semiconductor at a temperature below the melting points of the semiconductor and the basic material of the support, substantially the whole of one main face of the wafer being in contact with the support, heating the assembly of the wafer and the support in such a manner that heat is conducted to the wafer via the support thereby causing a temperature gradient to be established across the thickness of the wafer, said one main face of the wafer being hotter than the other main face, and that part only of the wafer forms a molten alloy with a part only of the support, and subjecting the assembly of the wafer and the support to a cooling process so that the molten alloy is solidified integrally bonded to the unalloyed parts of the wafer and the support, the solidified alloy providing a good electrical connection between the unalloyed parts of the wafer and the support, and the arrangement being such that the bonding process does not result in any substantial alteration of the physical characteristics of the unalloyed part of the wafer.

Preferably, during the bonding process said other main face of the wafer is maintained in contact with a member having a thermal capacity considerably greater than that of the wafer.

One arrangement in accordance with the present invention will now be described by way of example with reference to the accompanying drawings, in which:

FIGURE 1 is a central sectional elevation shown partly broken away, of an apparatus used in the manufacture of a germanium point contact diode intended for use as a high frequency mixer diode; and FIGURE 2 is a central sectional elevation of the completed diode.

Referring to the drawings, the diode is manufactured from a wafer 1 of N-type germanium of resistivity 3 milliohm centimetre, the wafer 1 having main faces 0.38 millimetre square and originally having a thickness of 0.2 millimetre. One main face of the wafer 1 is bonded to a flat end surface of a circular cylindrical metal support 2, the support 2 having a length of 5 millimetres and a diameter of 0.75 millimetre; the support 2 is made of an alloy comprising by weight 29% nickel, 17% cobalt and 54% iron.

Referring now particularly to FIGURE 1, in the process used for bonding the wafer 1 to the support 2, use is made of a heating element in the form of a carbon block 3 which has a length of 25 millimetres, a width of 4.8 millimetres and a thickness of 3.2 millimetres, the block 3 being mounted between two metal posts 4 with its main faces horizontal. A circular cylindrical hole 5 is centrally formed in the block 3, and a circular cylindrical stainless steel holder 6 fits in the hole 5 with its axis vertical, a circumferential flange 7 formed integral with the upper end of the holder 6 resting on the upper surface of the block 3. In the holder 6 there is centrally formed a circular cylindrical recess 8 having a depth of 2.5 millimetres and a diameter such that part of the support 2 can be snugly fitted in the recess 8. Use is also made of a heat sink in the form of a stainless steel plunger 9 of circular cross-section, the major part of the plunger 9 having a diameter of about 6 millimetres but an end portion 10 of the plunger 9 being chamfered so as to leave a circular flat end surface 1.6 millimetres in diameter.

The bonding of the wafer 1 to the support 2 is carried out as follows. Part of the support 2 is fitted in the recess 8 (as shown in FIGURE 1) so that the axis of the support 2 extends vertically, that end of the support 2 to which the wafer 1 is to be bonded being uppermost. The wafer 1 is then centrally placed on the upper end of the support 2, and the assembly of the block 3, the holder 6, the support 2 and the wafer 1 is mounted in a container which includes a glass bell jar 11. The plunger 9 is mounted in a holder 12 disposed above the bell jar 11, the plunger 9 being a sliding fit in a vertically extending circular cylindrical hole 13 formed in the holder 12 with the end portion 10 of the plunger 9 lowermost. The end portion 10 of the plunger 9 is then lowered through a circular hole 14 centrally formed in the bell jar 11 until the end portion 10 comes into contact with the upper surface of the wafer 1; the holder 12 is positioned so that the wafer 1 is centrally disposed with respect to the end portion 10 and so that the plunger 9 is allowed to bear down on the wafer 1 under its own weight.

An electric current is then passed through the carbon block 3 via the two metal posts 4, the current being gradually increased until the temperature of that part of the support 2 adjacent the wafer 1 reaches a value such that a layer, between 0.05 and 0.1 millimetre thick, of the wafer 1 contiguous with the support 2 forms a molten alloy with the adjacent part of the support 2; the fact that the upper main face of the wafer 1 is in contact with the plunger 9 (which of course has a thermal capacity considerably greater than that of the wafer 1) causes heat to be conducted away from this face thereby enabling this alloying process to be so controlled that the upper part of the wafer 1 remains unalloyed. The alloying process is observed under a microscope (not shown), and, after the molten alloy has been formed, the electric current through the block 3 is switched off and the assembly of the support 2 and wafer 1 is allowed to cool. During the cooling process the molten alloy solidifies into a layer 15 (see FIGURE 2) which serves to bond the unalloyed part of the wafer 1 to the unalloyed part of the support 2 and which forms a good electrical connection between these parts. The coefficients of linear expansion of germanium and the alloy used for the support 2 are $6.6 \times 10^{-6}$ per ° C. and $6.1 \times 10^{-6}$ per ° C. respectively, and, with the size of wafer involved, these coefficients are sufficiently well matched to ensure that the wafer 1 does not crack during the heating and cooling processes. Moreover the physical characteristics, and particularly the resistivity, of the unalloyed part of the wafer 1 remain substantially unaffected by the bonding process.

An atmosphere of nitrogen is maintained in the bell jar 11 during the heating and cooling processes in order to inhibit oxidation of the wafer 1 and support 2, the nitrogen being pumped in through a pumping stem (not shown) and escaping through the hole 14.

The assembly of the wafer 1 and support 2 is removed from the block 3 and the manufacture of the diode is completed as follows. Referring now particularly to FIGURE 2, the support 2 is tightly fitted inside a brass bush 16 in such a manner that that end of the support 2 to which the wafer 1 is bonded is substantially in register with one end face of the bush 16. One end of a quartz tube 17 is sealed to this end of the bush 16, the tube 17 being coaxial with the support 2.

A metal whisker 18, which is to form a contact member for the diode, is soldered to one end of a nickel support 19 which is similar in size to the support 2; this support 19 is also tightly fitted in a brass bush 20 in such a manner that that end of the support 19 to which the whisker 18 is soldered is substantially in register with one end face of the bush 20. This end face of the bush 20 is sealed to that end of the quartz tube 17 remote from the bush 16, the arrangement being such that the free end of the metal whisker 18 makes a point contact with the exposed main face of the wafer 1.

The quartz tube 17, the bushes 16 and 20 and the supports 2 and 19 form an envelope for the diode.

It is found that the diode described above has appreciably improved properties with regard to the noise generated in the diode in operation as compared with diodes which are similar in all respects to the diode described above except that the semiconductor wafer is bonded to the metal support by means of a conventional soldering technique. Thus, the noise level at the output of a superheterodyne radio receiver designed to operate at frequencies of between 26 and 41 kilomegacycles per second and in which the diode described above is used as the frequency changer is reduced by about two decibels compared with the noise level at the output of a similar receiver in which one of the last-mentioned diodes is used as the frequency changer.

In an alternative arrangement to that described above, the support 2 may be plated with copper to a thickness of 0.005 millimetre prior to the bonding of the wafer 1 to the support 2. In this case, during the heating process, that part of the copper plating in contact with the wafer 1 would form a molten alloy with part of the wafer 1 and with the adjacent part of the support 2.

I claim:

1. A method of manufacturing a semiconductor valve including the steps of placing a germanium semiconductor wafer in contact with a metallic support which is capable of alloying with germanium at a temperature below the melting points of germanium and the basic material of the support, substantially the whole of one main face of the wafer being in contact with the support, heating the assembly of the wafer and the support in such a manner that heat is conducted to the wafer via the support thereby causing a temperature gradient to be established across the thickness of the wafer, said one main face of the wafer being hotter than the other main face, and that part only of the wafer forms a molten alloy with a part only of the support, and subjecting the assembly of the wafer and the support to a cooling process so that the molten alloy is solidified integrally bonded to the unalloyed parts of the wafer and the support, the solidified alloy providing a good electrical connection between the unalloyed parts of the wafer and the support, and the arrangement being such that the bonding process does not result in any substantial alteration of the physical characteristics of the unalloyed part of the wafer.

2. A method according to claim 1, in which during the bonding process said other main face of the wafer is maintained in contact with a member having a thermal capacity considerably greater than that of the wafer.

3. A method according to claim 1, including the further step of bringing into contact with said other main face of the wafer a metallic member which makes a small area rectifying contact with the wafer.

References Cited by the Examiner

UNITED STATES PATENTS

| | | | |
|---|---|---|---|
| 2,166,998 | 7/39 | Morgan | 29—501 XR |
| 2,226,944 | 12/40 | Reeve | 29—504 XR |
| 2,406,310 | 8/46 | Agule | 29—504 XR |
| 2,762,953 | 9/56 | Berman | 317—234 |
| 2,768,596 | 10/56 | Kalbow et al. | |
| 2,777,975 | 1/57 | Aigrain. | |
| 2,801,603 | 8/57 | Reichelt. | |
| 2,903,628 | 9/59 | Giacoletto. | |
| 2,945,285 | 7/60 | Jacobs. | |
| 2,961,769 | 11/60 | Weissfloch | 29—501 XR |
| 3,030,557 | 4/62 | Dermit | 317—234 |
| 3,030,704 | 4/62 | Hall | 29—505 XR |
| 3,071,704 | 1/63 | Pighini | 29—504 XR |
| 3,082,522 | 3/63 | Doelp | 29—504 XR |

JOHN F. CAMPBELL, *Primary Examiner.*